(12) United States Patent
Karlsson et al.

(10) Patent No.: US 6,171,962 B1
(45) Date of Patent: Jan. 9, 2001

(54) SHALLOW TRENCH ISOLATION FORMATION WITHOUT PLANARIZATION MASK

(75) Inventors: Olov Karlsson, San Jose; Christopher F. Lyons, Fremont, both of CA (US); Basab Bandyopadhyay, Austin, TX (US); Nick Kepler, Saratoga, CA (US); Larry Wang, San Jose, CA (US); Effiong Ibok, Sunnyvale, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 08/993,889

(22) Filed: Dec. 18, 1997

(51) Int. Cl.[7] .................................................. H01L 21/302
(52) U.S. Cl. ........................ 438/692; 638/695; 638/697; 638/700
(58) Field of Search .................................. 438/690, 691, 438/692, 740, 700, 697, 427, 778, 720

(56) References Cited

U.S. PATENT DOCUMENTS

| | | | |
|---|---|---|---|
| 4,613,888 | * | 9/1986 | Mase et al. ............................. 357/54 |
| 5,094,972 | * | 3/1992 | Pierce et al. ............................ 437/67 |
| 5,298,110 | * | 3/1994 | Schoenborn et al. ................. 156/626 |
| 5,702,977 | * | 12/1997 | Jang et al. ............................. 438/427 |
| 5,817,567 | * | 10/1998 | Jang et al. ............................. 438/427 |

* cited by examiner

Primary Examiner—Felisa Hiteshew
Assistant Examiner—Lan Vinh

(57) ABSTRACT

An insulated trench isolation structure with large and small trenches of differing widths is formed in a semiconductor substrate without a planarization mask or etch. Embodiments include forming trenches and refilling them with an insulating material which also covers the substrate surface, followed by polishing to remove an upper portion of the insulating material and to planarize the insulating material above the small trenches. A second layer of insulating material is then deposited to fill seams in the insulating material above the small trenches and to fill steps in the insulating material above the large trenches. The insulating material is then planarized. Since the insulating material is partially planarized by the first polish and the seams and steps are filled by the second deposition, the resulting topography of the upper surface of the second layer of insulating material is small enough to enable a direct final polish without the need to create and implement a planarization mask and to perform an etch and mask removal, thereby reducing manufacturing costs and increasing production throughput.

11 Claims, 6 Drawing Sheets

SHALLOW TRENCH ISOLATION FORMATION WITHOUT PLANARIZATION MASK

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by forming field oxide regions by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween.

A typical method of trench formation comprises initially growing a pad oxide layer on the substrate, and depositing a barrier nitride layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material such as silicon dioxide derived from tetraethyl orthosilicate (TEOS) to form a field oxide region. The insulating material is then planarized, as by chemical-mechanical polishing (CMP) using the barrier nitride layer as a polish stop, to remove all the oxide over the active regions so that only the trenches are filled. The nitride and pad oxide are stripped off the active areas to complete the trench isolation structure.

It is difficult to planarize the insulating material, because the field oxide regions vary largely in size. For example, one trench may have a width as little as $0.25\mu$, while an adjacent trench may be several microns wide. After the insulating material is deposited to fill the trenches and cover the polish stop, fissures called "seams" exist in the deposited insulating material above the smaller trenches, and indentations called "steps" exist in the upper surface of the insulating material above the large trenches, which steps are considerably deeper and wider than the seams. The presence of both seams and steps is problematic during polishing, in that the large amount of polishing required to remove the seams over the small features results in the removal of excess insulating material over the large features. This overpolishing of the insulating material above the large trenches produces undesirable "dishing" of the insulating material, resulting in a nonplanar insulating surface.

A conventional approach to the problem of simultaneously planarizing an insulating material over both large and small features comprises masking, etching and then polishing, as by CMP. This procedure is illustrated in FIGS. 1A–1C. Adverting to FIG. 1A, there is schematically illustrated substrate 11, pad oxide layer 12, polish stop 13, oxide liner 14, trenches 15, insulating layer 16, seams 17 and steps 18. Inverse source/drain photoresist mask 19 is formed on the insulating layer 16 to protect the seams 17 and steps 18 from overetching. Isotropic etching is then performed to remove most of the insulating material in the active areas (FIG. 1B) before the final chemical-mechanical polish, as shown in FIG. 1C.

Disadvantageously, the inverse source/drain mask 19 is a "critical mask"; i.e., it is extremely complex and difficult to design and use. Its creation requires a complicated algorithm to calculate the location of the steps and seams and to provide protective masking over them, since even seams over the smallest features must be protected while etching. Moreover, the complexity of the mask and its small features challenges the capabilities of the photolithographic process necessary to implement the mask, thereby increasing manufacturing costs and reducing production throughput. As design rules are reduced to as small as $0.18\mu$ or less, the inverse source/drain mask becomes even more difficult and costly to design and use.

In copending application Ser. No. 08/992,490, filed Dec. 18, 1997, now U.S. Pat. No. 6,124,183, and copending application Ser. No. 08/992,491, filed Dec. 18, 1997, now U.S. Pat. No. 6,090,713, methods were disclosed for forming an STI structure by planarizing the insulating material using a simplified planarization mask. Copending application Ser. No. 08/992,490 discloses a method wherein after the insulating material is deposited, it is polished, as by CMP, such that the insulating material above the small trenches (i.e., at the seams) is planarized, then the insulating material is furnace annealed to increase the resistance of the seams to etching. Following annealing, a simplified photoresist planarization mask is applied to cover only the insulating material above the large trenches (i.e., the steps), and the unmasked portions of the insulating material are etched. The mask is then removed and the remaining insulating material is planarized, as by CMP.

Copending application Ser. No. 08/992,491 filed Dec. 18, 1997, now U.S. Pat. No. 6,090,713 discloses a method wherein after the insulating material is deposited, it is polished, as by CMP, such that the insulating material above the small trenches (i.e., at the seams) is planarized, then a second, thin layer of insulating material is deposited to fill the seams. Following the second deposition of insulating material, which effectively eliminates the seams, a simplified photoresist planarization mask is applied to cover only the insulating material above the large trenches (i.e., the steps), and the unmasked portions of the insulating material are etched. The mask is then removed and the remaining insulating material is planarized, as by CMP.

The methodologies disclosed in copending application Ser. No. 08/992,490, filed Dec. 18, 1997 and copending application Ser. No. 08/992,491, filed Dec. 18, 1997, now U.S. Pat. No. 6,090,713 simplify the planarization mask by providing for masking only the insulating material over the large trenches. Thus, the design and implementation of the required mask is facilitated. However, these methodologies still require a planarization mask and an etching procedure, followed by removal of the mask, before planarization can be completed.

There exists a need for a simplified, cost-effective method of manufacturing a semiconductor device with shallow trench isolation without the necessity of employing a mask for planarizing the field oxide.

SUMMARY OF THE INVENTION

An object of the present invention is a method of manufacturing a semiconductor device having insulated trenches formed in a semiconductor substrate, wherein an insulating material which fills the trenches and acts as the field oxide is planarized without using an inverse source/drain mask.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having a plurality of trenches formed in a semiconductor substrate or in an epitaxial layer on the semiconductor substrate, which method comprises: forming a pad oxide layer on a main surface of the substrate or epitaxial layer; forming a polish stop layer having an upper surface on the pad oxide layer; forming a large trench and a small trench, the large trench having a width at the main surface greater than a width at the main surface of the small trench; depositing a first layer of an insulating material to fill the trenches and cover the polish stop layer, whereby the first layer of the insulating material has a seam above the small trench and has a step in its upper surface above the large trench; performing a first polish to substantially planarize a portion of the first layer of the insulating material above the small trench; depositing a second layer of the insulating material to fill the seam and the step; and performing a second polish to planarize such that the upper surface of the first layer of the insulating material is substantially flush with the upper surface of the polish stop layer.

Another aspect of the present invention is a method of manufacturing an integrated circuit, comprising: forming a silicon oxide pad layer on a main surface of the substrate or an epitaxial layer formed on the substrate; forming a silicon nitride polish stop layer having an upper surface on the silicon oxide pad layer; providing a photoresist source/drain mask on the silicon nitride polish stop layer, the source/drain mask containing a pattern having a plurality of openings; etching to remove portions of the underlying nitride polish stop and pad oxide layers and to form a large trench and a small trench, the large trench having a width at the main surface greater than a width at the main surface of the small trench; thermally growing a thin silicon oxide layer lining each trench; depositing a first layer of an insulating material to fill the trenches and cover the silicon nitride polish stop layer, the first layer of the insulating material comprising silicon dioxide derived from tetraethyl orthosilicate (TEOS) by low pressure chemical vapor deposition (LPCVD), silicon dioxide derived from silane by LPCVD, or a high density plasma oxide, whereby the first layer of the insulating material has a seam above the small trench and has a step in its upper surface above the large trench; performing a first polish by chemical-mechanical polishing (CMP) to substantially planarize a portion of the first layer of the insulating material above the small trench; depositing a second layer of the insulating material to fill the seam and the step and to cover the upper surface of the first layer of the insulating material; and performing a second polish by CMP to planarize such that the upper surface of the first layer of the insulating material is substantially flush with the upper surface of the silicon nitride polish stop layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The use of a critical mask followed by an etching step and removal of the mask to planarize the insulating material filling the trenches diadvantageously increases manufacturing costs and reduces production throughput. The methodologies disclosed in copending application Ser. No. 08/992, 490, filed Dec. 18, 1997 and copending application Ser. No. 08/992,491, fuked Dec, 18, 1997 now U.S. Pat. No. 6,090, 713 are effective in forming an STI structure with a simplified planarization mask, with an attendant increase in production throughput and an economic benefit. However, the present invention achieves even greater advantages with a significant reduction in manipulative steps by eliminating the planarization mask entirely, along with the subsequent etching and mask removal steps, thereby further increasing throughput and reducing production costs.

According to the methodology of the present invention, a source/drain photoresist mask is formed on a polish stop layer which, in turn, is formed on a pad oxide layer on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate.

After masking, the substrate is etched to form large and small trenches, the large trenches being wider than the small trenches. An oxide liner is grown in each trench and an insulating material is deposited to fill the trench and cover the polish stop layer. A seam is generally formed in the deposited insulating material above each of the small trenches, and a step is formed above each of the large trenches. The insulating material is then polished, as by CMP, to remove extreme high points in the insulating material and to planarize the insulating material above the small trenches. A second layer of insulating material is then deposited to fill the seams and the steps. Because this second deposition of insulating material occurs on a relatively planar surface, the resulting second layer of insulating material will have no new seams or steps. Planarization is completed by conducting polishing until reaching the polish stop, as by CMP.

The inventive methodology provides for filling the seams over the small trenches and the steps over the large trenches with the second deposition of insulating material after partial planarization of the first layer of insulating material. Therefore, only minor topography is created on the upper surface of the second layer of insulating material, and the insulating material is easily planarized without using a masking/etching/stripping process. The present invention thereby avoids the need to create and implement a critical mask, and also eliminates the etching and mask removal operations, enabling production costs to be reduced and manufacturing throughput to be increased.

Figure 1A:
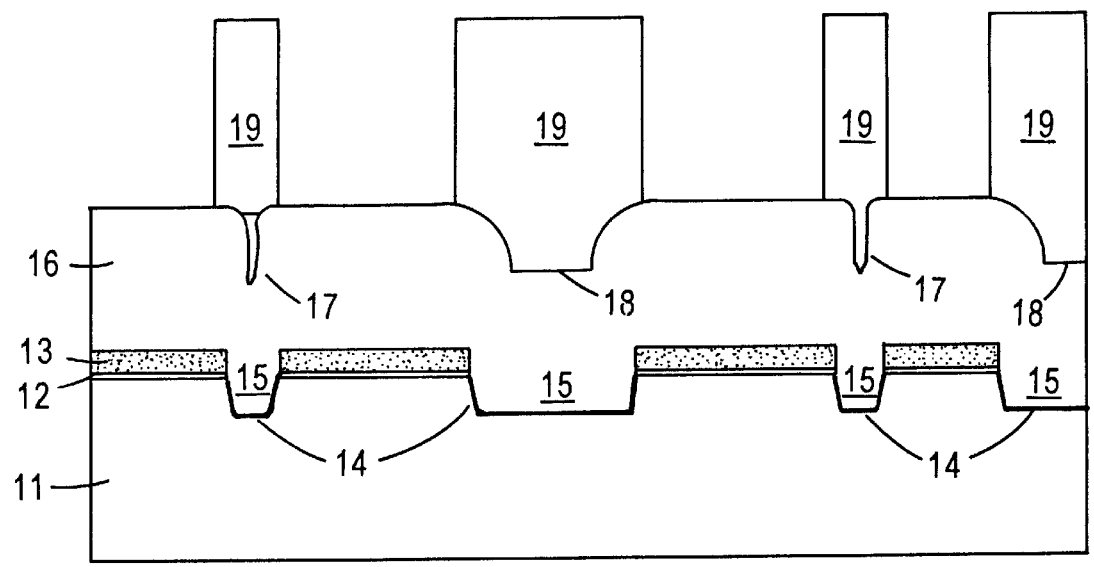
FIGS. 1A–1C schematically illustrate sequential phases of a complex method of STI formation.
Figure 1B:
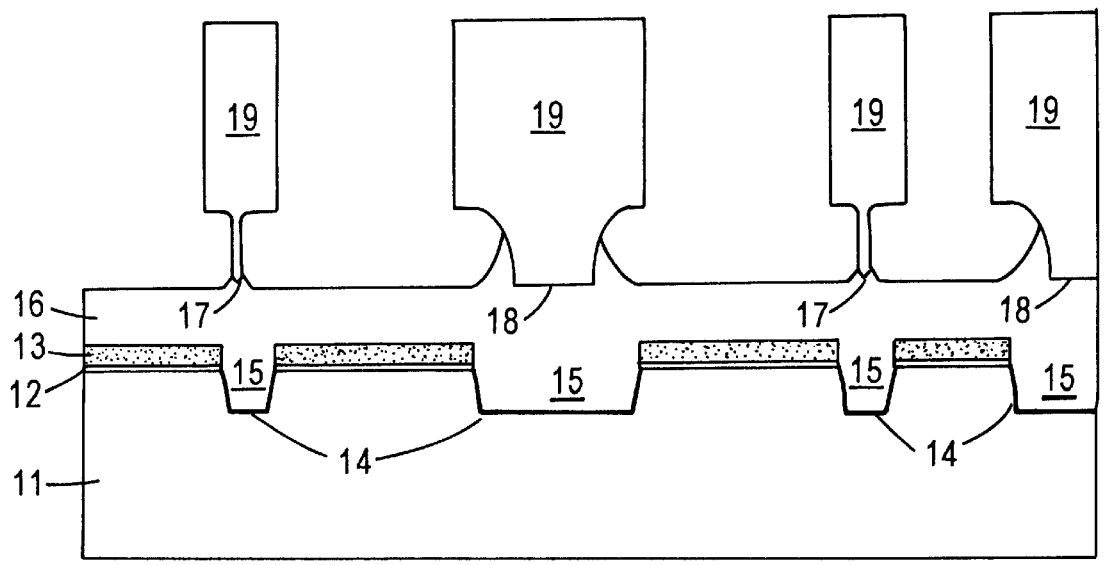
Figure 1C:
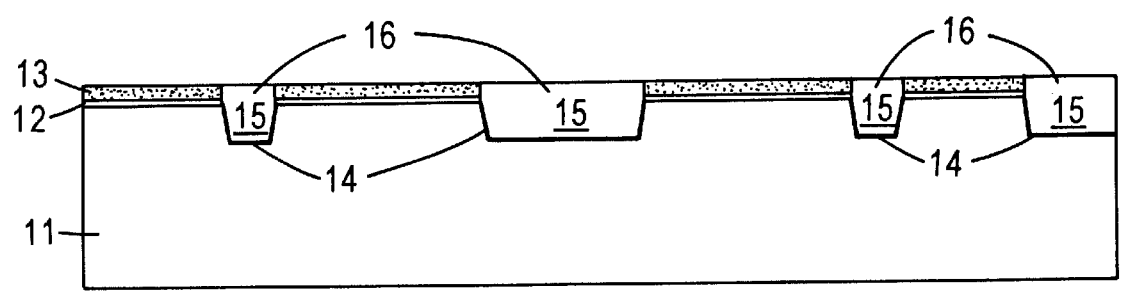
Figure 2A:
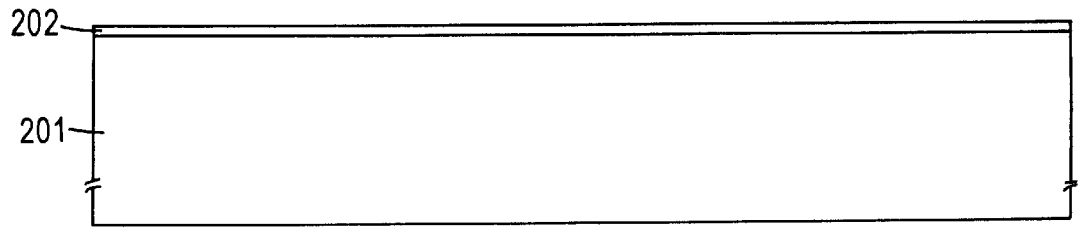
FIGS. 2A–2I schematically illustrate sequential phases of a method in accordance with an embodiment of the present invention.

An embodiment of the present invention is illustrated in FIGS. 2A–2I, wherein sequential phases in forming a semiconductor device in accordance with the present invention are depicted. Referring to FIG. 2A, substrate 201 is prepared having a substantially planar surface, typically a semiconductor substrate comprising doped monocrystalline silicon or an epitaxial layer formed on a semiconductor substrate in accordance with conventional practices. A pad oxide layer 202 is then grown on the substrate 201. Pad oxide layer 202 is typically silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer. FIG. 2A illustrates silicon substrate 201 and the pad oxide layer 202.

Figure 2B:
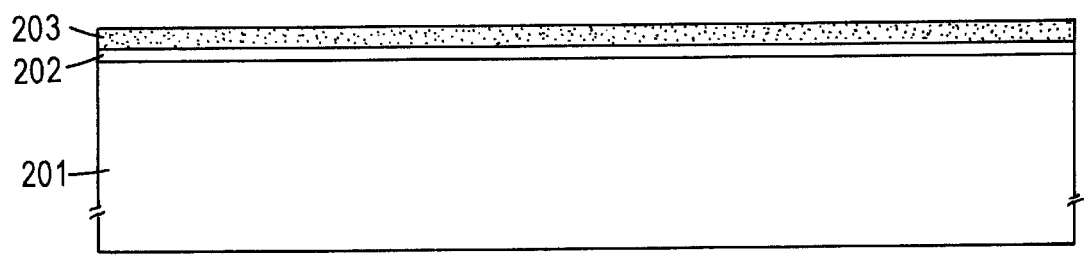

After formation of the pad oxide layer 202, a polish stop layer 203 is deposited on the pad oxide layer 202, as shown in FIG. 2B, such as a silicon nitride layer by CVD. Silicon oxide pad layer 202 functions as a buffer layer cushioning stresses between substrate 201 and polish stop layer 203. Polish stop layer 203 functions as an oxidation mask as it is resistant to the diffusion of oxygen and water vapor therethrough, thereby preventing an oxidizing species from reaching the underlying silicon substrate, as well as acting as a polish stop.

Figure 2C:
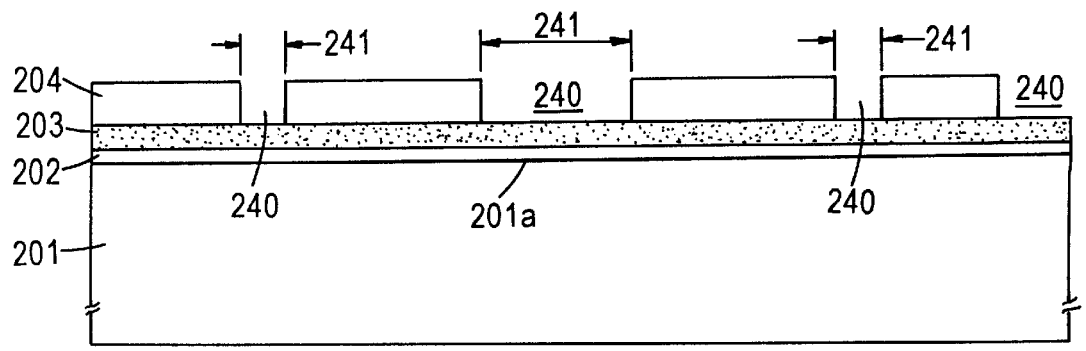
Figure 2D:
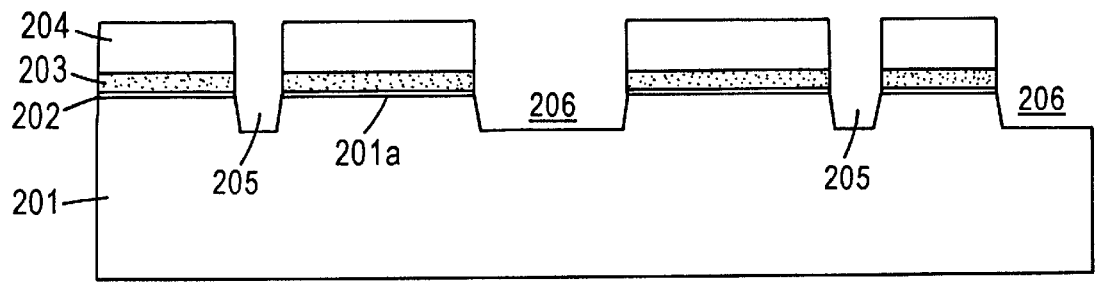

A photoresist source/drain mask 204 is then formed on polish stop layer 203, as shown in FIG. 2C. Photoresist source/drain mask 204 has a pattern defined by openings 240, which generally have a width 241 substantially corresponding to the width of the subsequently formed trenches at the main surface 201a of the substrate 201. The polish stop layer 203 is then etched away, and the etching continues through the pad oxide layer 202 and into the substrate 201 to form the shallow trenches 205, 206, as shown in FIG. 2D. The trench openings 205, 206 vary in width, each opening 206 having a width at main surface 201a greater than the width at main surface 201a of openings 205. The trenches 205, 206 are typically etched to a depth of up to about 4000 Å. In practicing the present invention, a trench depth of about 2500 Å to about 3000 Å has been found particularly suitable. When the etching of the trenches 205, 206 is completed, the photoresist 204 is stripped off the polish stop layer 203.

Figure 2E:
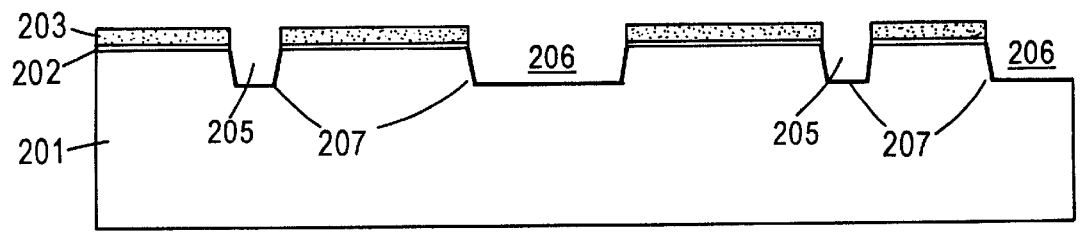
Figure 2F:
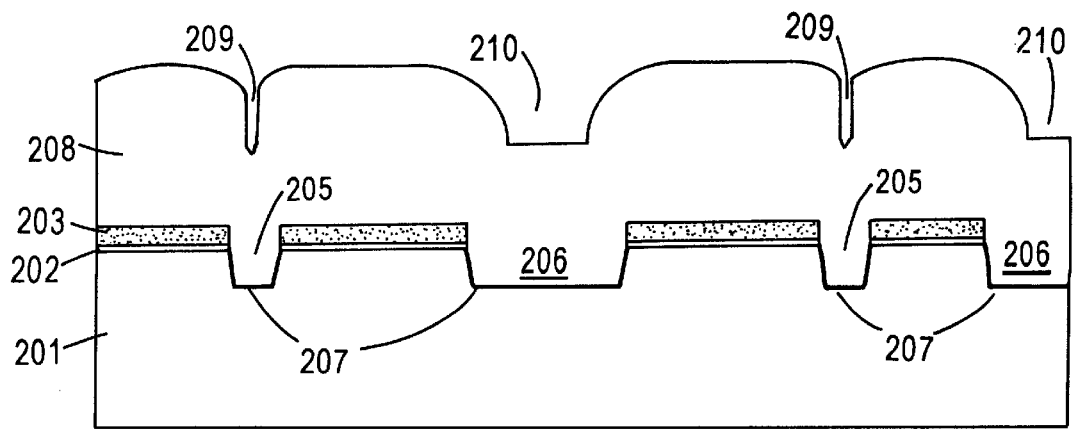

Thereafter, the surface of the trenches 205, 206 is thermally oxidized to form an oxide liner 207 on the inner surface of trenches 205, 206, typically at a temperature of about 1000° C. or higher. FIG. 2E shows the trenches 205, 206 with the completed liners 207. Subsequent to formation of the oxide liner 207, trenches 205, 206 are filled with a first layer of a suitable insulating material 208, as shown in FIG. 2F. Such insulating material 208 can comprise silicon dioxide derived from TEOS by LPCVD or derived from silane by LPCVD. The trenches 205, 206 can also be filled with a high density plasma (HDP) oxide, preferably employing the methodology disclosed in copending application Ser. No. 08/924,133, filed Sep. 5, 1997, the entire disclosure of which is hereby incorporated herein by reference. Due to the nature of the insulating material, after deposition the first layer of insulating material 208 has a seam 209 above each of the small trenches 205 and has a step 210 above each of the large trenches 206.

Figure 2G:
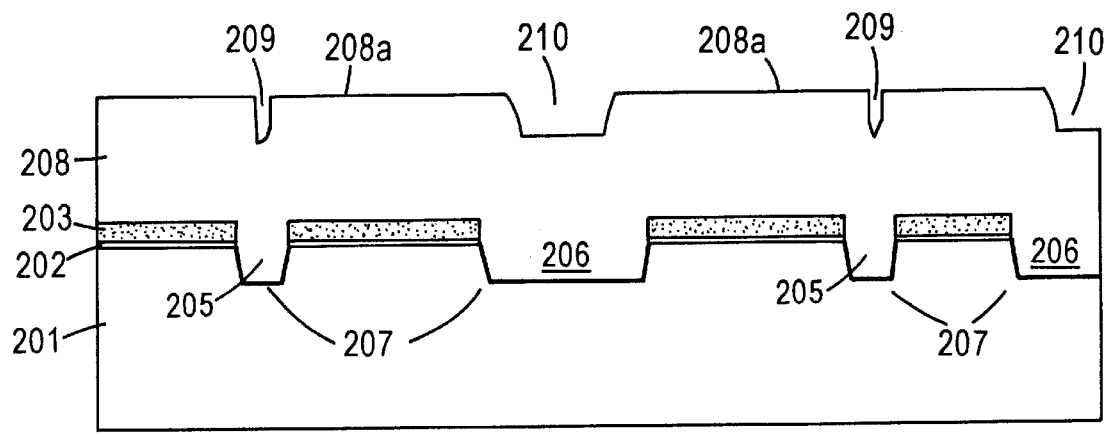

Subsequent to trench filling, the first layer of insulating material 208 is polished, as by CMP, to partially planarize it, as shown in FIG. 2G. Polishing is typically carried out until the upper surface 208a of the first layer of insulating material 208 above the small trenches 205 is substantially planarized. After this initial polishing step, the seams 209 and the steps 210 still exist, but the extremes of the topography of the first layer of insulating material 208 are removed, and the first layer of insulating material 208 above the small trenches 205 is substantially flat.

Figure 2H:
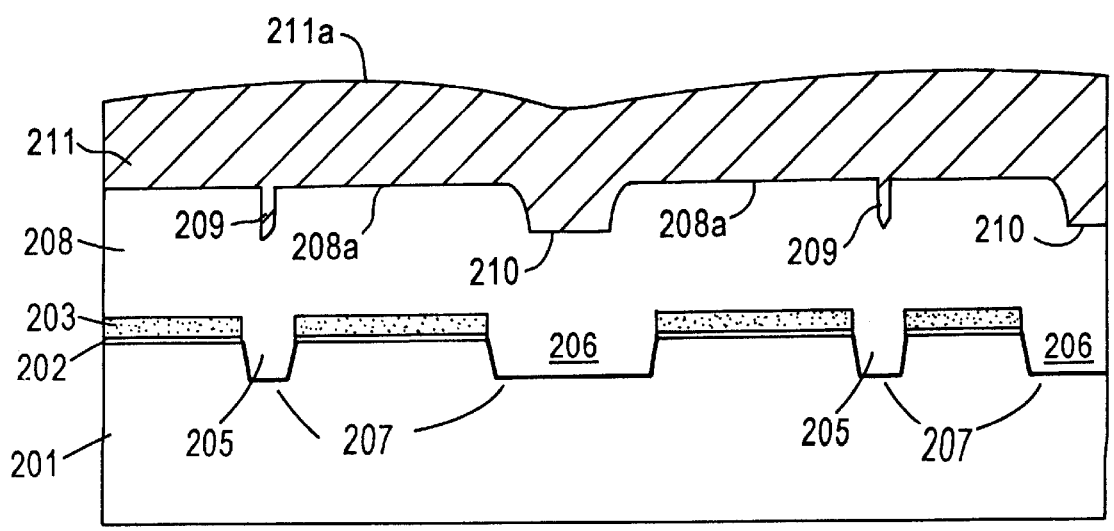
Figure 2I:
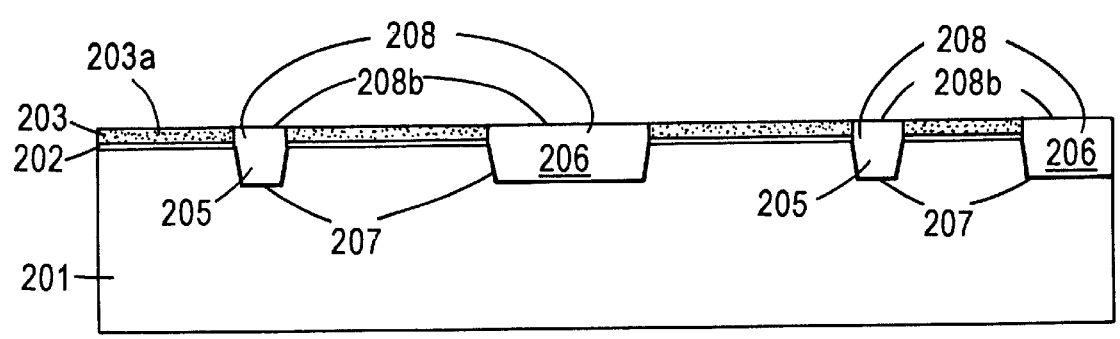

Next, referring to FIG. 2H, a second layer of insulating material 211 is deposited to fill the seams 209 over the small trenches 205, to fill the steps 210 over the large trenches 206, and to cover the upper surface 208a of the first layer of insulating material 208, using any of the techniques and materials discussed in reference to the deposition of the initial layer of insulating material 208. Since the deposition of the second layer of insulating material 211 takes place on a partially planar surface 208a, no new seams are created; rather, the seams 209 are filled in. Moreover, due to the thickness of the second layer of insulating material 211, no new steps are created either, resulting in only minor topography at the upper surface 211a of the second layer of insulating material 211. After deposition of the second layer of insulating material 211, the insulating material of layers 208 and 211 is polished, as by CMP, such that the upper surface 208b of the insulating material 208 is substantially flush with the upper surface 203a of the polish stop layer 203, as depicted in FIG. 2I.

The first polish, which partially planarizes the first layer of insulating material, and the second deposition of, insulating material, which fills and effectively eliminates the seams 209 and the steps 210, results in a substantially planar topography on the upper surface of the second layer of insulating material 211. Thus, the inventive methodology enables substantially complete planarization of the insulating material at the second polish without a planarization mask and, hence, without any subsequent etching and mask removal steps, thereby enabling an increase in production throughput and an attendant economic benefit. The present invention is applicable to the manufacture of various types of semiconductor devices having STI, particularly high density semiconductor devices having a design rule of about 0.25µ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having a plurality of trenches formed in a semiconductor substrate or in an epitaxial layer on the semiconductor substrate, which method comprises:

forming a pad oxide layer on a main surface of the substrate or epitaxial layer;

forming a polish stop layer having an upper surface on the pad oxide layer;

forming a large trench and a small trench, the large trench having a width at the main surface greater than a width at the main surface of the small trench;

depositing a first layer of an insulating material to fill the trenches and cover the polish stop layer, whereby the first layer of the insulating material has a seam above the small trench and has a step in its upper surface above the large trench;

performing a first polish to substantially planarize a portion of the first layer of the insulating material above the small trench;

depositing a second layer of the insulating material to fill the seam and the step after performing the first polish; and performing a second polish to planarize such that the upper surface of the first layer of the insulating material is substantially flush with the upper surface of the polish stop layer.

2. The method according to claim 1, comprising:

providing a source/drain mask on the polish stop layer, the source/drain mask containing a pattern having a plurality of openings;

etching to remove portions of the underlying polish stop and pad oxide layers and to form the trenches; and thermally growing an oxide layer lining each trench.

3. The method according to claim 2, wherein the pad oxide layer comprises silicon oxide and the polish stop layer comprises silicon nitride.

4. The method according to claim 2, wherein the source/drain mask comprises a photoresist mask.

5. The method according to claim 3, wherein each opening in the source/drain mask has a width substantially equal to the width of one of the plurality of trenches at the main surface.

6. The method according to claim 5, wherein the plurality of trenches are each etched to a depth of up to about 4000 Å.

7. The method according to claim 6, wherein the plurality of trenches are each etched to a depth of about 2500 Å to about 3000 Å.

8. The method according to claim 3, comprising heating at a temperature of at least 1000° C. to thermally grow a silicon oxide liner.

9. The method according to claim 3, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

10. The method according to claim 9, comprising polishing the first and second layers of the insulating material by chemical-mechanical polishing.

11. A method of manufacturing an integrated circuit, comprising:

forming a silicon oxide pad layer on a main surface of the substrate or an epitaxial layer formed on the substrate;

forming a silicon nitride polish stop layer having an upper surface on the silicon oxide pad layer;

providing a photoresist source/drain mask on the silicon nitride polish stop layer, the source/drain mask containing a pattern having a plurality of openings;

etching to remove portions of the underlying nitride polish stop and pad oxide layers and to form a large trench and a small trench, the large trench having a width at the main surface greater than a width at the main surface of the small trench;

thermally growing a thin silicon oxide layer lining each trench;

depositing a first layer of an insulating material to fill the trenches and cover the silicon nitride polish stop layer, the first layer of the insulating material comprising silicon dioxide derived from tetraethyl orthosilicate (TEOS) by low pressure chemical vapor deposition (LPCVD), silicon dioxide derived from silane by LPCVD, or a high density plasma oxide, whereby the first layer of the insulating material has a seam above the small trench and has a step in its upper surface above the large trench;

performing a first polish by chemical-mechanical polishing (CMP) to substantially planarize a portion of the first layer of the insulating material above the small trench;

depositing a second layer of the insulating material to fill the seam and the step and to cover the upper surface of the first layer of the insulating material after performing the first polish; and performing a second polish by CMP to planarize such that the upper surface of the first layer of the insulating material is substantially flush with the upper surface of the silicon nitride polish stop layer.

* * * * *